United States Patent
Setlur et al.

(10) Patent No.: US 7,884,382 B2
(45) Date of Patent: Feb. 8, 2011

(54) RULES FOR EFFICIENT LIGHT SOURCES USING PHOSPHOR CONVERTED LEDS

(75) Inventors: Anant A. Setlur, Niskayuna, NY (US); Steven Duclos, Clifton Park, NY (US); Josesph Shiang, Niskayuna, NY (US); Alok Mani Srivastava, Niskayuna, NY (US); Holly Ann Comanzo, Niskayuna, NY (US); Stanton Earl Weaver, Northville, NY (US); Charles Adrian Becker, Schenectady, NY (US); Thomas Soules, Livermore, CA (US)

(73) Assignee: GE Lighting Solutions, LLC, Cleveland, OH (US)

( * ) Notice: Subject to any disclaimer, the term of this patent is extended or adjusted under 35 U.S.C. 154(b) by 484 days.

(21) Appl. No.: 10/590,262

(22) PCT Filed: Feb. 22, 2005

(86) PCT No.: PCT/US2005/006098
§ 371 (c)(1),
(2), (4) Date: Nov. 29, 2007

(87) PCT Pub. No.: WO2005/083036
PCT Pub. Date: Sep. 9, 2005

(65) Prior Publication Data
US 2008/0135860 A1    Jun. 12, 2008

(51) Int. Cl.
*H01L 33/00* (2010.01)
*H01L 21/00* (2010.01)
(52) U.S. Cl. ............ 257/98; 257/E33.067; 438/29
(58) Field of Classification Search .......... 257/98, 257/E33.067; 438/29
See application file for complete search history.

(56) References Cited

U.S. PATENT DOCUMENTS

| | | | |
|---|---|---|---|
| 6,466,135 B1 * | 10/2002 | Srivastava et al. | 340/815.4 |
| 6,501,100 B1 * | 12/2002 | Srivastava et al. | 257/79 |
| 6,522,065 B1 * | 2/2003 | Srivastava et al. | 313/503 |
| 6,765,237 B1 * | 7/2004 | Doxsee et al. | 257/98 |
| 2003/0214233 A1 * | 11/2003 | Takahashi et al. | 313/512 |
| 2004/0135504 A1 * | 7/2004 | Tamaki et al. | 313/512 |

* cited by examiner

Primary Examiner—Lex Malsawma
(74) Attorney, Agent, or Firm—Fay Sharpe LLP

(57) ABSTRACT

An LED lamp including an LED and one or more phosphors, wherein for each phosphor, a figure of merit (FOM) defined as the product of (incident LED flux)×(excitation cross-section of the phosphor)×(phosphor material decay time) is less than 0.3. Such an arrangement provides a light emitting device with improved lumen output and color stability over a range of drive currents.

14 Claims, 3 Drawing Sheets

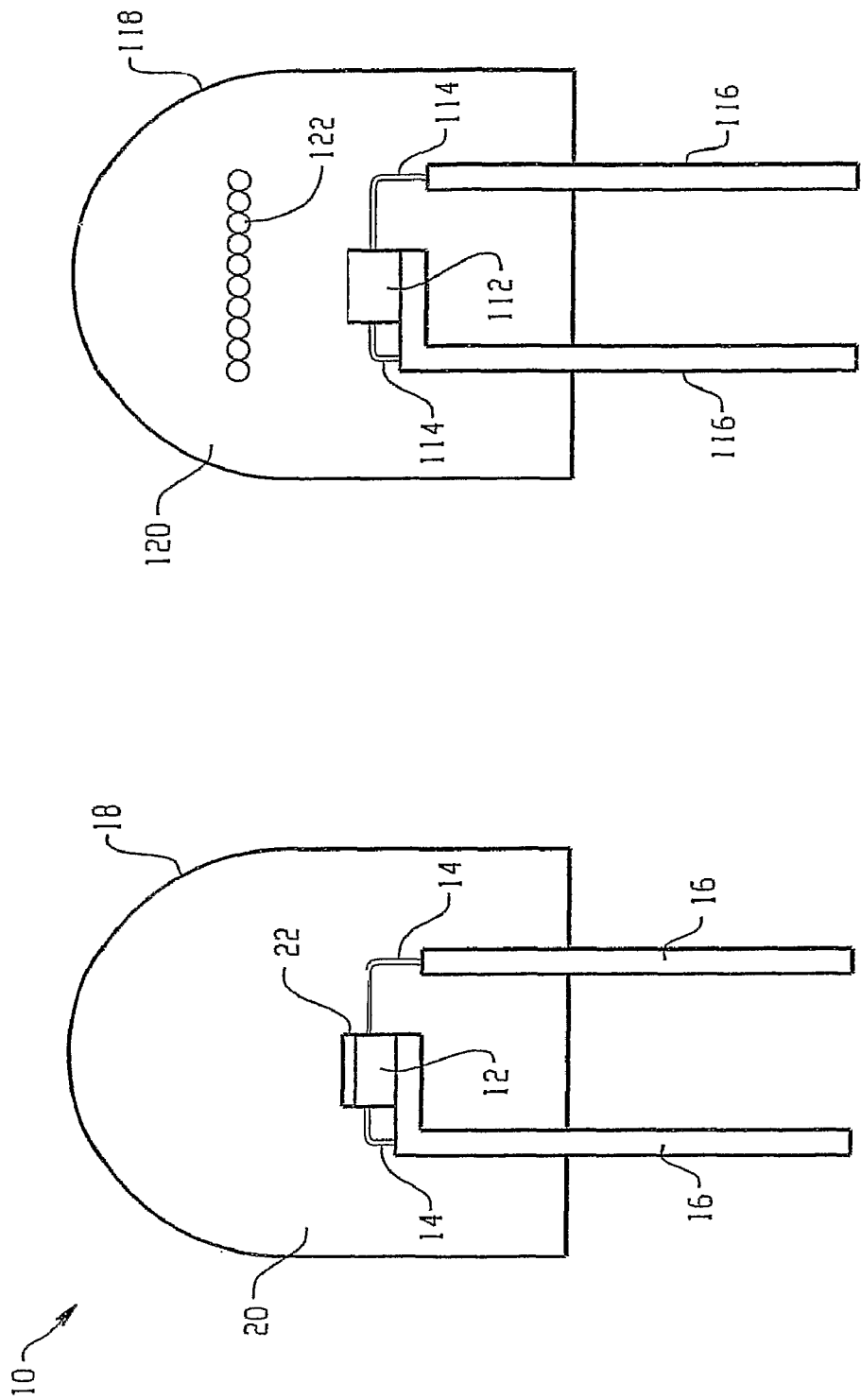

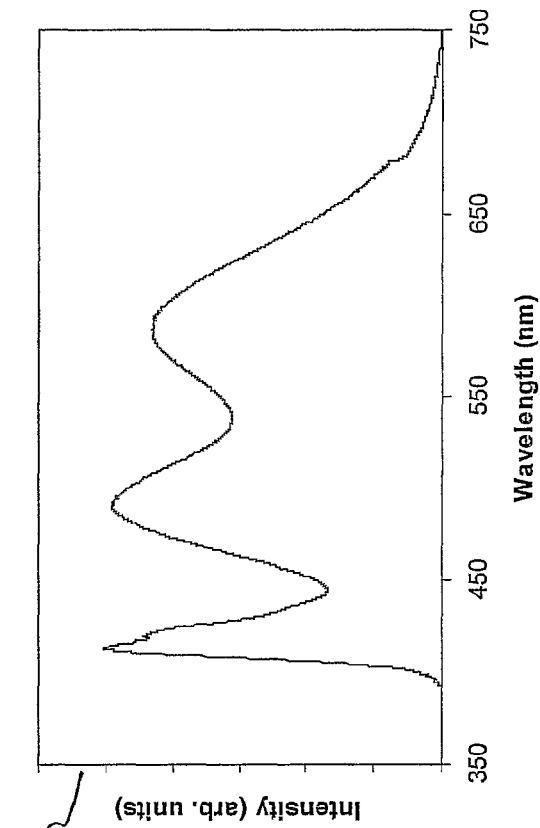
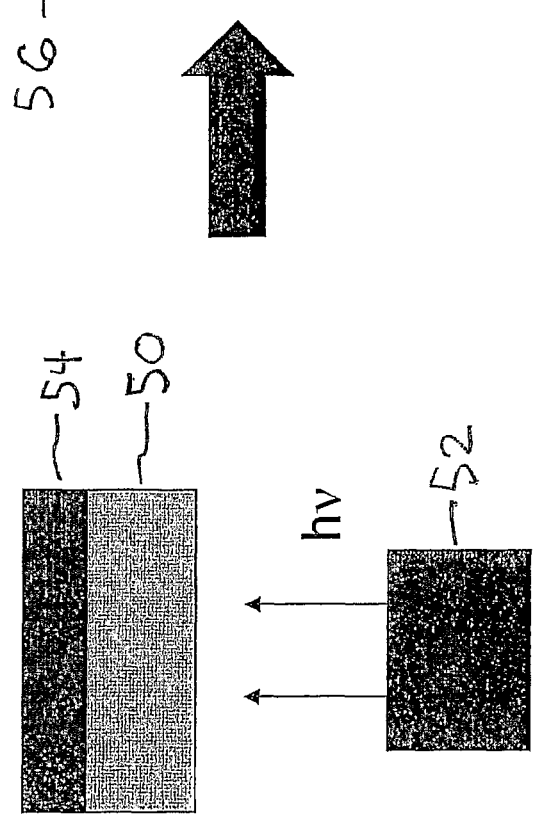
FIG 5

RULES FOR EFFICIENT LIGHT SOURCES USING PHOSPHOR CONVERTED LEDS

BACKGROUND

The present exemplary embodiments relate to a method for layering phosphors in a light emitting diode ("LED") device to produce efficient lighting devices and minimize non-linear effects. It finds particular application in conjunction with LEDs, and will be described with particular reference thereto. However, it is to be appreciated that the present exemplary embodiment is also amenable to other like applications.

Light emitting diodes ("LEDs") are well-known solid state devices that can generate light having a peak wavelength in a specific region of the light spectrum. LEDs are typically used as illuminators, indicators and displays. However, the potential for general illumination is also enormous. Originally, the most efficient LEDs emitted light having a peak wavelength in the red region of the light spectrum, i.e., red light. However, a type of LED based on a gallium nitride (GaN) die has also been developed that can efficiently emit light having a peak wavelength in the blue and/or UV region of the spectrum. This type of LED can now provide significantly brighter output light.

Since blue and UV light have a shorter peak wavelength than red light, the blue/UV light generated by a GaN-based LED die can be readily converted to light having a longer peak wavelength. It is well known in the art that light having a first peak wavelength (the "primary light") can be converted into light having a longer peak wavelength (the "secondary light") using a process known as phosphorescence. The phosphorescence process involves the absorption of the primary light by a photoluminescent phosphor material, which acts to excite the atoms of the phosphor material to emit the secondary light. The peak wavelength of the secondary light will depend on the phosphor material. The type of phosphor material can be chosen to yield secondary light having a particular peak wavelength.

According to U.S. Pat. No. 5,998,925, a phosphor comprised of $(Y_{0.4}Gd_{0.6})_3Al_5O_{12}$:Ce, for example, is used to convert a portion of a blue emitted light from a GaN die to yellow light. The total emission of the LED device, consisting of blue GaN device generated light and yellow phosphor emitted light is a generally white light. According to U.S. Pat. No. 6,522,065, a similar result can be achieved using a UV emitting GaN die. In this patent a phosphor comprised of $Ca_{1.94}Na_{1.03}Eu_{0.03}Mg_2V_3O_{12}$, for example, is used to convert at least a substantial portion of the GaN emitted UV light to white light.

There are two primary problems in the white LED lamps described above, which are particularly present in UV-LED devices. First, if the absorption of the phosphor at the emitted UV wavelength is not high, then there is a significant amount of radiation emitted from the die that bleeds through the phosphor coating. Since the eye does not perceive UV radiation well, the overall lumen output of the lamp is reduced. Similarly, too much blue light bleed-through disturbs the lamp color. To combat this bleedthrough and reduce the required thickness of the phosphor layer, new phosphors have been developed with increased quantum efficiency (QE) and greater absorption of LED radiation. However, this increased QE and absorption only contributed to the second problem, wherein phosphors with slow decay times that are subjected to high incident fluxes from the LED chip can lead to saturation. This loss mechanism can severely limit the efficiency of white light or saturated color light sources. In addition, other requirements, such as a substantially constant color point with a varying LED drive current, are virtually impossible to meet if there is significant phosphor saturation.

Thus, a need exists for a method to select and/or arrange phosphors in an LED lamp to minimize saturation of the phosphors and thereby improve lamp efficiency and maintain a stable lamp color through a range of drive currents.

BRIEF DESCRIPTION

In accordance with one aspect of the present exemplary embodiment, there is provided a light emitting device including a light emitting diode or laser and one or more phosphor materials, wherein for each phosphor material, the product of (incident LED flux)×(excitation cross-section of the phosphor)×(phosphor material decay time) is less than 0.3.

In accordance with a second aspect of the present exemplary embodiments, there is provided a method for producing a phosphor conversion LED lamp, the method including providing an LED chip and subsequently depositing one or more phosphor materials over the LED chip, wherein the phosphor materials are selected and deposited such that for each phosphor material, the product of (incident LED flux)×(excitation cross-section of the phosphor)×(phosphor material decay time) is less than 0.3.

Depending on the phosphors selected for inclusion in the lamp, the phosphors may be deposited closer or further away from the LED chip to satisfy the above equation. For phosphors with fast decay times, the above equation may typically be satisfied even if such phosphors are placed close to the LED chip. For phosphors with slow decay times, then the lamp should be designed such that these phosphors are placed further away from the LED chip to reduce the average incident flux on the phosphor.

BRIEF DESCRIPTION OF THE DRAWINGS

FIG. 1 is a schematic cross-sectional view of an illumination system in accordance with one embodiment of the present invention.

FIG. 2 is a schematic cross-sectional view of an illumination system in accordance with a second embodiment of the present invention.

FIG. 5 is an illustration of a specific phosphor laydown strategy in an example of one of the present embodiments.

DETAILED DESCRIPTION

Figure 4:
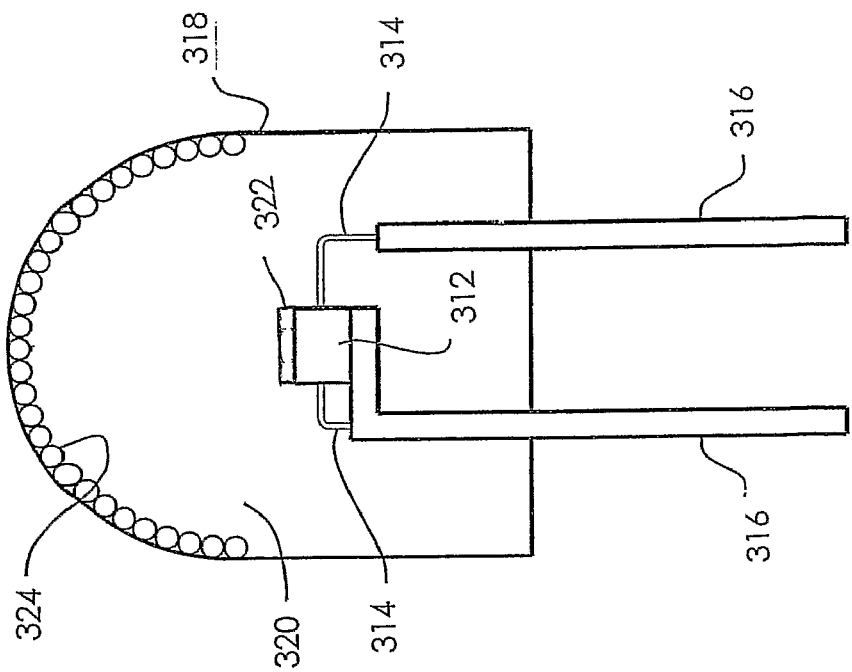
FIG. 4 is a schematic cross-sectional view of an illumination system in accordance with a fourth embodiment of the present invention.

With reference to FIG. 1, an exemplary phosphor-conversion light emitting device or lamp 10 is shown. The light emitting assembly 10 comprises a semiconductor UV or blue radiation source, such as a light emitting diode (LED) chip 12 and leads 14 electrically attached to the LED chip. The leads 14 may comprise thin wires supported by a thicker lead frame(s) 16 or the leads may comprise self supported electrodes and the lead frame may be omitted. The leads 14 provide current to the LED chip 12 and thus cause the LED chip 12 to emit radiation.

The LED chip 12 may be encapsulated within a shell 18, which encloses the LED chip and an encapsulant material 20. The shell 18 may be, for example, glass or plastic. Preferably, the LED 12 is substantially centered in the encapsulant 20.

The encapsulant 20 is preferably an epoxy, plastic, low temperature glass, polymer, thermoplastic, thermoset material, resin or other type of LED encapsulating material as is known in the art. Optionally, the encapsulant 20 is a spin-on glass or some other high index of refraction material. Preferably, the encapsulant material 20 is an epoxy or a polymer material, such as silicone. The shell can optionally be omitted or be the same material as the encapsulant. Both the shell 18 and the encapsulant 20 are preferably transparent or substantially optically transmissive with respect to the wavelength of light produced by the LED chip 12 and a phosphor containing layer 22. The LED chip 12 may be supported, for example, by the lead frame 16, by the self supporting electrodes, the bottom of the shell 18, or by a pedestal (not shown) mounted to the shell or to the lead frame.

The structure of the illumination system includes a phosphor layer 22 radiationally coupled to the LED chip 12. Radiationally coupled means that the elements are associated with each other so radiation from one is transmitted to the other. This phosphor composition 22 is deposited on the LED chip 12 by any appropriate method. For example, a water based suspension of the phosphor(s) can be formed, and applied as a phosphor layer to the LED surface. In one such method, a silicone slurry in which the phosphor particles are randomly suspended is placed around the LED. Thus, the phosphor composition 22 may be coated over or directly on the light emitting surface of the LED chip 12 by coating and drying the phosphor suspension over the LED chip 12. Both the shell 18 and the encapsulant 20 are preferably transparent or otherwise designed to allow white light 24 to be transmitted through those elements.

The device may include any semiconductor blue or UV light source that is capable of producing white light when its emitted radiation is directed onto the phosphor. In a preferred embodiment, the semiconductor light source comprises a blue emitting LED doped with various impurities. Thus, the LED may comprise a semiconductor diode based on any suitable III-V, II-VI or IV-IV semiconductor layers and preferably has an emission wavelength of about 250 to 500 nm. Preferably, the LED may contain at least one semiconductor layer comprising GaN, ZnSe or SiC. For example, the LED may comprise a nitride compound semiconductor represented by the formula $In_iGa_jAl_kN$ (where $0 \leq i$; $0 \leq j$; $0 \leq k$ and $i+j+k=1$) having an emission wavelength greater than about 250 nm and less than about 500 nm. Such LED semiconductors are known in the art. The radiation source is described herein as an LED for convenience. However, as used herein, the term is meant to encompass all semiconductor radiation sources including, e.g., semiconductor laser diodes.

One exemplary LED chip is formed with a first cladding layer such as GaN disposed on a substrate, such as Si, or sapphire and has a structure of $n\text{-}Al_wGa_{(1-w)}N$. An optional n-GaN cladding layer may also be added. An active layer including InGaN multiple quantum well layer is formed next. Disposed on the active layer is a series of optional p-type cladding layers such as $p\text{-}Al_vGa_{(1-v)}N$ structure, a $p\text{-}Al_vGa_{(1-v)}N$ cladding layer and a p-GaN cladding layer. To complete the structure, metallic contacts are formed on the top (p-type) and bottom (n-type) surfaces. To form a laser diode, reflective surfaces can be formed along opposing edges to define the laser cavity. A suitable composition for the p-type contact is nickel-gold, either alloyed or with a nickel-rich composition in contact with the p-GaN layer and a gold rich composition in contact with the nickel-rich layer. A suitable composition for the n-type contact is titanium-aluminum, either alloyed or with a titanium-rich composition in contact with the substrate and an aluminum-rich composition in contact with the titanium rich layer. The contacts may be deposited by any means known in the art.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

Organic light emissive structures are known in the art. A common high-efficiency organic emissive structure is referred to as the double heterostructure LED. This structure is very similar to conventional, inorganic LED's. In this type of device, a support layer of glass is coated by a thin layer of indium/tin oxide (ITO) to form the substrate for the structure. Next, a thin (100-500 Å) organic, predominantly hole-transporting, layer (HTL) is deposited on the ITO layer. Deposited on the surface of the HTL layer is a thin (typically, 50-100 Å) emissive layer (EL). If these layers are too thin, there may be breaks in the continuity of the film; as the thickness of the film increases, the internal resistance increases, requiring higher power consumption for operation. The emissive layer (EL) provides the recombination site for electrons, injected from a 100-500 Å thick electron transporting layer (ETL) that is deposited upon the EL, and holes from the HTL layer. The ETL material is characterized by considerably higher mobility for electrons than for charge deficient centers (holes).

In operation, electrical power is supplied to the die 12 to activate it. When activated, the die 12 emits the primary light away from its top surface. The emitted primary light is absorbed by the phosphor containing layer 22. The phosphor layer 22 then emits a secondary light, i.e., converted light having a longer peak wavelength, in response to absorption of the primary light. The secondary light is emitted randomly in various directions by the phosphor in the layer 22. Some of the secondary light is emitted away from the die 12, propagating through the encapsulant 20 (which may act as a lens) and exiting the device 10 as output light. The encapsulant and/or shell 18 may direct the output light in a general direction as desired.

One disadvantage of the design of FIG. 1, is that in phosphors with slow decay times (i.e. long luminescence lifetimes), the high fluxes present in certain LEDs lead to a large excited steady state population. This leads to saturation of the available phosphor and degrades the luminescent efficiency of the phosphor, leading to reduced lumen output. In addition, at high LED drive currents, the larger UV flux tends to degrade the luminescence efficiency of these phosphors even further, leading to severe changes in the color temperature for different drive currents. This is especially a problem for UV-LED phosphors. For example, in the $Eu^{2+}$—$Mn^{2+}$ energy transfer phosphors, which can be used with UV emitting LED chips, the incident UV light from the chip is absorbed by $Eu^{2+}$ ions and that energy is then transferred to $Mn^{2+}$, leading to green, yellow, orange, or red emission from $Mn^{2+}$. The main problem lies in the slow decay time of $Mn^{2+}$ (>10 ms) which makes it susceptible to a saturation effect. This problem is exacerbated in phosphors with high absorptions, i.e. the type preferably used to reduce incident UV bleedthrough. Consequently, there is a trade-off between UV-bleedthrough and saturation in the set of UV-LED phosphors that are based upon the $Eu^{2+}$—$Mn^{2+}$ energy transfer couple, thereby reducing the efficiency of these lamps.

Generally, the present invention provides a phosphor selection/layering strategy which improves the lumen output and color stability of LED based lamps that work by converting LED radiation into a desired color by the choice of appropriate phosphors. The strategy is believed to be particularly effective with LEDs emitting between 350-490 nm but is not limited thereto.

According to one of the present embodiments, a figure of merit ("FOM") is defined as the product of (incident LED flux)×(excitation cross-section)×(phosphor decay time). The LED lamp is designed such that for each phosphor component in the lamp, this FOM is less than 0.3. A preferred FOM is less than 0.1. Applicants have found that satisfying this FOM will reduce saturation effects and maintain high lamp efficiency.

The FOM equation and desired value is derived from taking into account, for example, ground state depletion effects of $Mn^{2+}$; a physical phenomenon within the $Eu^{2+}$—$Mn^{2+}$ phosphor when placed in a LED package. Ground state depletion occurs when a significant fraction of the $Mn^{2+}$ ions in the phosphor are in the excited state. When this occurs, $Eu^{2+}$ can no longer transfer energy to a $Mn^{2+}$ ion in the ground state, leading to a quenching process.

Measurement of the components of the FOM requires straightforward time resolved luminescence measurements. The phosphor decay time can be first measured outside of the LED in a spectrometer, giving one component of the FOM detailed in this document. The next step is to determine the product of (incident flux)(excitation cross-section) in units of $s^{-1}$. Measuring the individual components of this product is not trivial given that the phosphor layer consists of micron sized particles which scatter incident LED radiation. However, this product can be easily measured by measuring the luminescence output of an LED as a function of its duty cycle (% of time ON). For simplicity of measurement, we keep the LED pulse period constant for a fixed set of measurements and vary the ON time. If the luminescent intensity is not directly proportional to the ON time of the LED, then the phosphor coating is saturating under the intense flux of LED excitation with a corresponding reduction in the phosphor efficiency.

One can then plot the relative phosphor efficiency as a function of ON time, and then back out the (incident flux) (excitation cross-section) values of the FOM using equations known in the open literature as described by S. Mikoshiba, S. Shirai, S. Shinada, and M. Fukushima; *J. Appl. Phys.* 50, 1088 (1979).

Another straightforward method to determine the (incident flux)(excitation cross-section) is to measure the phosphor luminescence vs. time immediately after the LED is turned ON, known as either a rise time measurement or a build-up measurement. In a typical measurement, the phosphor luminescence build-up over time (t) can be fitted to:

Intensity=$k*1-\exp(-t/\tau_{rise})$ where $\tau_{rise}$ is a fitted rise time for the phosphor in the LED. Once $\tau_{rise}$ is determined via this measurement, then the product of (incident flux))(cross-section) is:

(incident flux)(cross-section):$1/\tau_{rise}-1/$(phosphor decay time)

After the analysis for determining the FOM, then the phosphor QE in LED package (assuming no thermal losses) is:

QE(LED)=QE(spectrometer)/(1+FOM)

The desired FOM value can be met for each phosphor in several ways. These include 1) selection of phosphors with fast decay times (e.g. <3 ms); 2) placement of the phosphors in a manner which minimizes the average incident flux on the phosphors; or 3) a combination of the two.

For example, one can meet the above FOM and thereby avoid saturation effects by using faster decaying phosphors in the LED lamp, such as those based upon $Eu^{3+}$ (decay time of about 1 ms), $Tb^{3+}$ (decay time of about 3 ms), $Mn^{4+}$ (decay time of about 3 ms), $Pr^{3+}$ (decay time of about 1-500 ms), $Eu^{2+}$ (decay time of about 1 ms), or $Ce^{3+}$ (decay time of <100 ns). For theses types of phosphors, the decay time component of the FOM is sufficiently low enough to meet the 0.3 target value and thereby reduce or prevent saturation effects.

Alternately, if slower decay time phosphors are used, such as those based upon $Mn^{2+}$ (decay time of about 10 ms), then alternate LED lamp designs can be used to reduce average flux on the phosphor layers. One way of accomplishing this is to place a phosphor coating containing these slow decay phosphors further away from the LED chip, reducing the average flux on the phosphor.

These methods can be used in combination with each other. For example, phosphors with faster decay times can be placed closer to the LED chip and slower decay time phosphors can be placed on top of these faster phosphors. The initial faster decaying phosphor layer will scatter and absorb the incident LED radiation, which will reduce the incident flux on the slower decaying phosphors, preventing saturation in that layer. Such a coating strategy will maximize the efficiency of the whole device.

While the design shown in FIG. 1 may be suitable to meet the above FOM when phosphors with very fast decay times are used, other designs may be necessary for slower decay time phosphors. Thus, with reference to FIG. 2, a light-emitting device according to one embodiment of the present invention is shown. The structure of the embodiment of FIG. 2 is similar to that of FIG. 1, except that the phosphor layer 122 is positioned further away from the LED chip. This arrangement results in a lower incident LED flux, as the LED radiation is dispersed as it travels away from the LED chip. Thus, the FOM defined above can more easily be met by slower decaying phosphors.

Alternately, instead of a single phosphor layer 122, the phosphor composition can be interspersed within the encapsulant material 120. The phosphor (in the form of a powder) may be interspersed within a single region of the encapsulant material 120 or throughout the entire volume of the encapsulant material. If the phosphor is to be interspersed within the encapsulant material 120, then a phosphor powder may be added to a polymer precursor, loaded around the LED chip 112, and then the polymer precursor may be cured to solidify the polymer material. Other known phosphor interspersion methods may also be used, such as transfer loading.

Figure 3:
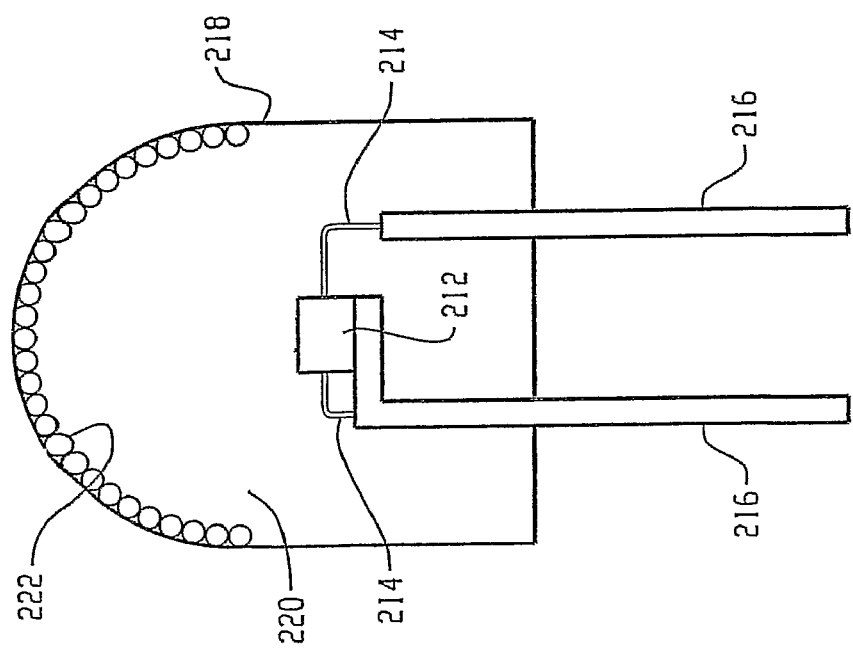
FIG. 3 is a schematic cross-sectional view of an illumination system in accordance with a third embodiment of the present invention.

FIG. 3 illustrates a third preferred structure of the system according to the preferred aspects of the present invention. The structure of the embodiment shown in FIG. 3 is similar to that of FIG. 1, except that the phosphor composition 222 is coated onto an outer surface of the encapsulant 220, or the surface of the shell 218 (if present), instead of being formed over the LED chip 212. If a shell 218 is present, the phosphor composition is preferably coated on the inside surface of the shell 218, although the phosphor may be coated on the outside surface of the shell, if desired. The phosphor composition 222 may be coated on the entire surface of the shell or only a top portion of the surface of the shell. Of course, the structures of FIGS. 1-3 may be combined and one or more phosphors may be located in any two or all three locations.

Thus, with reference now to FIG. 4, a light-emitting device according to one embodiment of the present invention is shown with two separate phosphor materials. The structure of the embodiment shown in FIG. 4 is similar to that of FIG. 1, except that a second phosphor composition 324 is coated onto a surface of the shell 318. A first phosphor material 322 is disposed over the LED chip 312.

The phosphor in the first layer 322 will preferably have a fast decay time, since it is positioned close to the LED chip and thus will be subjected to a high incident flux from the LED chip. The phosphor in the second layer 324 may be a phosphor with a longer decay time, as it will be subjected to a lower incident flux due to absorption and scattering of the LED radiation by the first layer. As detailed above, each phosphor in the lamp will have a FOM that is 0.3 or less. In the present description, although reference may be made to a single phosphor composition in each layer, it should be appreciated that both the first and second phosphor materials may contain two or more different phosphor compositions.

While the present embodiment shows one or two phosphor layers, the invention is not limited to such and embodiments are contemplated containing three or more phosphor layers. Advantageously, a semiconductor component in accord with this invention can be manufactured using conventional production lines.

The color temperature or color location of the generated light can be varied by a suitable choice of the phosphor material, particle size, and its concentration. In addition, luminous substance mixtures can also be employed, and as one advantageous result, the desired tonality of the color of the emitted light can be adjusted precisely.

As can be determined from the above equation for the FOM, a phosphor with a faster decay time can be positioned closer to a given LED (thereby being subjected to a higher incident flux) than a phosphor with a slower decay time while still meeting the 0.3 target. Thus, for example, phosphors used in the embodiment of FIG. 1 may have decay times on the order of about 1 ms or less in order to meet the FOM for a lamp using a convention LED chip with an average luminosity. Likewise, phosphors with slower decay times may be used in the embodiments of FIGS. 2-3 and as the second phosphor layer in FIG. 4. The selection of these phosphors will minimize saturation effects due to a high excited state population of ions within the phosphor layers, closest to the LED, where the incident flux is highest. The phosphor layer(s) further away from the LED can then use phosphors that have slower decay times (>3 ms) and/or have higher absorption of incident LED radiation.

The use of highly absorbing $Eu^{2+}$—$Mn^{2+}$ phosphors in the layers further away from the LED is especially useful as the second phosphor in embodiments described with respect to FIG. 4 because it helps to ensure a significant portion of the incident light that bleeds through the initial phosphor layers gets converted into useful visible light, increasing the efficiency of the LED device. If these phosphors were placed close to the LED, phosphor saturation effects from high incident light fluxes significantly reduce the quantum efficiency (QE) of the phosphor, leading to a lamp with a lower lumen output. However, in accord with the present layering strategy, the phosphor layer(s) closest to the LED absorb and scatter the incident radiation, thereby reducing the flux on the phosphor layer(s) further away from the LED. Consequently, phosphor saturation effects are significantly reduced and the phosphor layers that are away from the LED have higher QEs. This will improve the lumen output of the LED lamp.

Phosphors that may suitably be used in the present invention include, but are not limited to the following:

Blue:
$(Ba,Sr,Ca)_5(PO_4)_3(Cl,F,Br,OH):Eu^{2+}, Mn^{2+}, Sb^{3+}$
$(Ba,Sr,Ca)MgAl_{10}O_{17}:Eu^{2+}, Mn^{2+}$
$(Ba,Sr,Ca)BPO_5:Eu^{2+}, Mn^{2+}$
$(Sr,Ca)_{10}(PO_4)_6*nB_2O_3:Eu^{2+}$
$2SrO*0.84P_2O_5*0.16B_2O_3:Eu^{2+}$
$Sr_2Si_3O_8*2SrCl_2:Eu^{2+}$
$Ba_3MgSi_2O_8:Eu^{2+}$
$Sr_4Al_{14}O_{25}:Eu^{2+}$ (SAE)
$BaAl_8O_{13}:Eu^{2+}$ Blue-Green:
$Sr_4Al_{14}O_{25}:Eu^{2+}$
$BaAl_8O_{13}:Eu^{2+}$
$2SrO-0.84P_2O_{5-0.16}B_2O_3:Eu^{2+}$
$(Ba,Sr,Ca)MgAl_{10}O_{17}:Eu^{2+},Mn^{2+}$
$(Ba,Sr,Ca)_5(PO_4)_3(Cl,F,OH):Eu^{2+}, Mn^{2+}, Sb^{3+}$ Green:
$(Ba,Sr,Ca)MgAl_{10}O_{17}:Eu^{2+}, Mn^{2+}$ (BAMn)
$(Ba,Sr,Ca)Al_2O_4:Eu^{2+}$
$(Y,Gd,Lu,Sc,La)BO_3:Ce^{3+}, Tb^{3+}$
$Ca_8Mg(SiO_4)_4Cl_2:Eu^{2+}, Mn^{2+}$
$(Ba,Sr,Ca)_2SiO_4:Eu^{2+}$
$(Ba,Sr,Ca)_2(Mg,Zn)Si_2O_7:Eu^{2+}$
$(Sr,Ca,Ba)(Al,Ga,In)_2S_4:Eu^{2+}$
$(Y,Gd,Tb,La,Sm,Pr,Lu)_3(Al,Ga)_5O_{12}:Ce^{3+}$
$(Ca,Sr)_8(Mg,Zn)(SiO_4)_4Cl_2:Eu^{2+}, Mn^{2+}$ (CASI)
$Na_2Gd_2B_2O_7:Ce^{3+}, Tb^{3+}$
$(Ba,Sr)_2(Ca,Mg,Zn)B_2O_6:K,Ce,Tb$ Yellow-Orange:
$(Sr,Ca,Ba,Mg,Zn)_2P_2O_7:Eu^{2+}, Mn^{2+}$ (SPP);
$(Ca,Sr,Ba,Mg)_{10}(PO_4)_6(F,Cl,Br,OH):Eu^{2+}, Mn^{2+}$ (HALO);

$((Y,Lu,Gd,Tb)_{1-x}Sc_xCe_y)_2(Ca,Mg)_{1-r}(Mg,Zn)_{2+r}Si_{z-q}Ge_qO_{12+\delta}$, Red:
$(Gd,Y,Lu,La)_2O_3:Eu^{3+}, Bi^{3+}$
$(Gd,Y,Lu,La)_2O_2S:Eu^{3+}, Bi^{3+}$
$(Gd,Y,Lu,La)VO_4:Eu^{3+}, Bi^{3+}$
$(Ca,Sr)S:Eu^{2+}, Ce^{3+}$
$SrY_2S_4:Eu^{2+}; Ce^{3+}$
$CaLa_2S_4:Ce^{3+}$
$(Ca,Sr)S:Eu^{2+}$
$3.5MgO*0.5MgF_2*GeO_2:Mn^{4+}$ (MFG)
$(Ba,Sr,Ca)MgP_2O_7:Eu_{2+}, Mn_{2+}$
$(Y,Lu)_2WO_6:Eu^{3+}, Mo^{6+}$
$(Ba,Sr,Ca)_xSi_yN_z:Eu^{2+}, Ce^{3+}$ $(Ba,Sr,Ca,Mg)_3(Zn,Mg)Si_2O_8:Eu^{2+}, Mn^{2+}$ The decay times for the above phosphors are known or can be determined using known methods. Based on these decay times and calculations made using known LED chips, the proper placement of the phosphors desired by an end user can be determined such that the FOM for each phosphor is 0.3 or below. Thus, users can retain flexibility in designing lamps with desired light qualities by still choosing any combination of phosphors and LED chips as desired while maintaining lamp efficiency and reducing the risk of saturation effects.

EXAMPLES

Examples and demonstrations of how modifying the phosphors/laydown can lead to a reduction in saturation and improved device efficacy are now described. An initial comparison of LEDs made with 400-410 nm UV LED chips and two different phosphor compositions was made. A first sample (Sample 1) comprised a blend of $Sr_2P_2O_7:Eu,Mn$ ("SPP") and $Sr_4Al_{14}O_{25}:Eu$ ("SAE"). A second sample (Sample 2) comprised a blend of $Ca_5(PO_4)_3Cl:Eu,Mn$ ("HALO") and SAE. Since the phosphor blend of Sample 2 has a 20% higher quantum efficiency vs. Sample 1 (in a spectrometer) and also a 25-30% higher absorption of 405 nm light (for similar particle size phosphors), it was expected that the Sample 2 blend would be have a much higher lumen output vs. the Sample 1 blend in LED packages. Instead, the Sample 2 LEDs had 15-20% lower lumens in comparison to the Sample 1 LEDs. It was determined that the major cause of this discrepancy arose from saturation effects due to the high absorption of the HALO phosphor (FOM as defined above of 0.594) compared to a FOM of 0.196 for SPP.

Another example comes from experiments where the phosphor laydown was modified into a layered configuration as seen in FIG. 5. In these experiments, the lower absorbing Sample 1 blend 50 was placed closer to the LED chip 52 while the higher absorbing (and higher saturating) HALO phosphor 54 was placed further away from the LED chip. The emission characteristics of this lighting device using a UV chip as described above is shown at 56. This arrangement led to significant improvements in the lumen output (13 lumens/W at 350 mA drive current) compared to LEDs using Sample 1 (8.3 lumens/W) or Sample 2 (9 lumens/W) blends alone with an acceptable CCT value of 5200 and a high CRI of 85. This arrangement works because the lower saturating phosphor is closer to the LED while still having the benefits of a highly absorbing phosphor to convert as much of the UV-LED radiation to visible light.

With the foregoing description, examples and figures refer to particular embodiments of the invention, the invention is not intended to be limited thereto. For example, additional phosphor laydown strategies could be devised to meet the FOM and other desired characteristics of the lighting device. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

What is claimed is:

1. A light emitting device comprising an LED and at least one phosphor materials, wherein a first phosphor material with a decay time of less than about 3 ms is positioned close to the LED and a second phosphor material with a relatively slower decay time is positioned relatively further from the LED, and wherein for each phosphor material, the product of (incident LED flux)×(excitation cross-section of the phosphor)×(phosphor material decay time) is less than 0.3.

2. The device of claim 1, wherein the LED is comprised of a semiconductor material.

3. The device of claim 1, wherein the LED emits light between 350 and 490 nm.

4. The device of claim 1, wherein the product is less than 0.1.

5. The device of claim 1, wherein each phosphor material provides $Eu^{2+}$—$Mn^{2+}$ energy transfer.

6. The device of claim 1, wherein said first phosphor material includes at least one of $Eu^{3+}$, $Tb^{3+}$, $Mn^{4+}$, $Pr^{3+}$, $Eu^{2+}$, or $Ce^{3+}$.

7. The device of claim 6, wherein the second phosphor material is dispersed farther from the LED chip than the phosphor of claim 6 and wherein said second phosphor material has a slower decay time than the phosphor of claim 6.

8. The device of claim 1, wherein the second phosphor material is positioned remote to the LED.

9. The device of claim 1 having three or more phosphor layer.

10. The device of claim 9, wherein each phosphor layer in a direction outward from the LED has a longer decay time.

11. The device of claim 1 wherein said phosphor layers are comprised of one or more phosphor.

12. The device of claim 1 including a phosphor with a decay time less than about 1 ms and positioned relatively closer to the LED and a phosphor positioned farther away from the LED and having a decay time of greater than about 3 ms.

13. The device of claim 1, wherein $Eu^{2+}$—$Mn^{2+}$ phosphors are used in the layers farther from the LED.

14. A method for producing a phosphor conversion LED lamp, the method comprising the steps of providing an LED chip and subsequently depositing at least one phosphor material over the LED chip, wherein a first phosphor material with a decay time of less than about 3 ms is positioned close to the LED and a second phosphor material with a relatively slower decay time is positioned relatively further from the LED, and wherein the phosphor materials are selected and deposited such that for each phosphor material, the product of (incident LED flux)×(excitation cross-section of the phosphor)×(phosphor material decay time) is less than 0.3.

* * * * *